US010443143B2

(12) United States Patent
Miettinen et al.

(10) Patent No.: US 10,443,143 B2
(45) Date of Patent: *Oct. 15, 2019

(54) METHOD FOR PRODUCING A CHROMIUM COATING AND A COATED OBJECT

(71) Applicant: Savroc Ltd, Kuopio (FI)

(72) Inventors: Juha Miettinen, Hiltulanlahti (FI); Jussi Räisä, Kuopio (FI)

(73) Assignee: Savroc Ltd, Kuopio (FI)

( * ) Notice: Subject to any disclaimer, the term of this patent is extended or adjusted under 35 U.S.C. 154(b) by 63 days.

This patent is subject to a terminal disclaimer.

(21) Appl. No.: 15/111,609

(22) PCT Filed: Jan. 15, 2014

(86) PCT No.: PCT/FI2014/050031
§ 371 (c)(1),
(2) Date: Jul. 14, 2016

(87) PCT Pub. No.: WO2015/107256
PCT Pub. Date: Jul. 23, 2015

(65) Prior Publication Data
US 2016/0333494 A1 Nov. 17, 2016

(51) Int. Cl.
*C25D 5/48* (2006.01)
*C25D 3/06* (2006.01)
(Continued)

(52) U.S. Cl.
CPC ............... *C25D 5/48* (2013.01); *C23C 14/06* (2013.01); *C23C 16/45525* (2013.01);
(Continued)

(58) Field of Classification Search
CPC . C25D 5/48; C25D 3/06; C25D 3/562; C25D 3/14; C25D 5/50; C25D 5/14;
(Continued)

(56) References Cited

U.S. PATENT DOCUMENTS 2,859,158 A  11/1958 Scheer
3,164,897 A   1/1965 Patriarca et al.
(Continued)

FOREIGN PATENT DOCUMENTS

CN  1099432  3/1995
CN  1497065  5/2004
(Continued)

OTHER PUBLICATIONS

Blum et al. Protective Value of Nickel and Chromium Plating on Steel. Research Paper RP712 (Year: 1934).*
(Continued)

*Primary Examiner* — John E Uselding
(74) *Attorney, Agent, or Firm* — Ware, Fressola, Maguire & Barber LLP

(57) ABSTRACT

To produce a trivalent chromium based coating on an object, a layer of nickel phosphorus alloy is deposited on the object, an intermediate layer of another metal or metal alloy or ceramic is deposited on the NiP layer, and a chromium layer is deposited from a trivalent chromium bath on the intermediate layer. The coated object is subjected to one or more heat treatments to harden the coating and to produce multiphase layers including at least one layer containing crystalline Ni and crystalline Ni3P and at least one layer containing crystalline Cr. The intermediate layer can consist of copper, molybdenum, a metal alloy or a non-metallic solid, such as an oxide, nitride or carbide of a metal.

19 Claims, 3 Drawing Sheets

(51) Int. Cl.
*C25D 5/50* (2006.01)
*C25D 3/56* (2006.01)
*C25D 5/14* (2006.01)
*C23C 28/02* (2006.01)
*C23C 28/00* (2006.01)
*C23C 14/06* (2006.01)
*C23C 16/455* (2006.01)

(52) U.S. Cl.
CPC .......... *C23C 28/021* (2013.01); *C23C 28/027* (2013.01); *C23C 28/324* (2013.01); *C23C 28/34* (2013.01); *C25D 3/06* (2013.01); *C25D 3/562* (2013.01); *C25D 5/14* (2013.01); *C25D 5/50* (2013.01)

(58) Field of Classification Search
CPC . C23C 14/06; C23C 16/45525; C23C 28/021; C23C 28/027; C23C 28/324; C23C 28/34
See application file for complete search history.

(56) References Cited

U.S. PATENT DOCUMENTS

| | | | |
|---|---|---|---|
| 5,232,469 | A | 8/1993 | McEachron et al. |
| 5,252,360 | A | 10/1993 | Huttl et al. |
| 5,271,823 | A | 12/1993 | Schachameyer et al. |
| 5,413,646 | A | 5/1995 | Dash et al. |
| 6,846,367 | B2 | 1/2005 | Nam et al. |
| 7,910,231 | B2 | 3/2011 | Schuh et al. |
| 9,347,145 | B2 | 5/2016 | Bessho |
| 2005/0249927 | A1 | 11/2005 | Suzuki et al. |
| 2009/0211914 | A1 | 8/2009 | Huang et al. |
| 2010/0025255 | A1 | 2/2010 | Su et al. |
| 2012/0111613 | A1 | 5/2012 | Oguro et al. |
| 2015/0132604 | A1 | 5/2015 | Sue et al. |
| 2015/0361571 | A1 | 12/2015 | Miettinen et al. |
| 2016/0333493 | A1 | 11/2016 | Miettinen et al. |
| 2017/0159198 | A1 | 6/2017 | Miettinen et al. |

FOREIGN PATENT DOCUMENTS

| | | |
|---|---|---|
| CN | 101078132 | 11/2007 |
| CN | 101397685 | 4/2009 |
| CN | 101512047 | 8/2009 |
| CN | 101855388 A | 10/2010 |
| CN | 102196675 | 9/2011 |
| CN | 102471913 | 5/2012 |
| CN | 102644067 A | 8/2012 |
| CN | 102906311 A | 1/2013 |
| CN | 103132114 A | 6/2013 |
| CN | 103255454 A | 8/2013 |
| EP | 0446762 | 9/1991 |
| GB | 921977 | 3/1963 |
| JP | S54124831 | 9/1979 |
| JP | S60013094 | 1/1985 |
| JP | S60196209 A | 10/1985 |
| JP | S63203792 | 8/1988 |
| JP | H04214875 | 8/1992 |
| JP | H06248472 | 9/1994 |
| JP | H09095793 | 4/1997 |
| JP | 2002285375 | 10/2001 |
| JP | 2005206915 A | 8/2005 |
| JP | 2007023316 A | 2/2007 |
| JP | 2011179078 | 9/2011 |
| JP | 2013091811 A | 5/2013 |
| SE | 205488 | 6/1966 |
| WO | 2007007790 | 1/2007 |
| WO | 2011105392 | 9/2011 |
| WO | 2014111616 | 7/2014 |

OTHER PUBLICATIONS

Chapaneri, Roshan A study of hexavalent and trivalent chromium conversion coatings on zinc surfaces. (Year: 2010).*
Benaben, Patrick An Overview of Hard Chromium Plating Using Trivalent Chromium Solutions. Products Finishing. Jan. 31, 2011. https://www.pfonline.com/articles/an-overview-of-hard-chromium-plating-using-trivalent-chromium-solutions (Year: 2011).*
Official Journal of the European Union. Directive 2002/95/EC of the European Parliament and of the Council of Jan. 27, 2003 on the restriction of the use of certain hazardous substances in electrical and electronic equipment. Feb. 13, 2003. (Year: 2003).*
Yuncheng Zhang, et al., Electroplating Manual, Edition 3, p. 249, Jan. 31, 2007.
Benaben, P., "An Overview of Hard Chromium Plating Using Trivalent Chromium Solutions," posted on Jan. 31, 2011, http://www.pfonline.com/articles/an-overview-of-hard-chromium-plating-using-trivalent-chromium-solutions (8 pages).
Mu, S. et al., "Investigation of a transparent chromate (III) passive film on electroless Ni-P coating by XPS and electrochemical methods," Electrochimica Acta, vol. 54 (2009), pp. 6718-6724.
Jingli Fang, "Electroplating Coordination Compound-Theory and Application," pp. 504-508, 511-514, Chemical Industry Press, 2008.
Ching An Huang, et al., "Hardness variation and corrosion behavior of as-plated and annealed Cr—Ni alloy deposits electroplated in a trivalent chromium-based bath," 203 Surface & Coatings Technology 3686-3691, Jun. 6, 2009.
Ching An Huang, et al., "Microstructure analysis of a Cr—Ni multilayer pulse-electroplated in a bath containing trivalent chromium and divalent nickel ions," 255 Surface & Coatings Technology 153-157, Apr. 8, 2014.
Stadnik, Z.M., et al., "Magnetic properties and 61Ni Mössbauer spectroscopy of the ternary phosphide CrNiP", 20 Journal of Physics: Condensed Matter, Jun. 14, 2008.
Lanxess Deutschland GmbH et al., "Analysis of Alternatives", Sep. 2016, available at https://echa.europa.eu/documents/10162/70ae9192-4c86-4e68-9021-0a90f7b56444 (180 pages).

* cited by examiner

METHOD FOR PRODUCING A CHROMIUM COATING AND A COATED OBJECT

FIELD OF THE INVENTION

The invention relates to a method for producing a chromium coating on an object by trivalent chromium plating. The invention also relates to a coated object produced by the method.

BACKGROUND OF THE INVENTION

Chromium coating is widely used as a surface coating for metal articles because of its high hardness value, attractive appearance and superior wear and corrosion resistance. Traditionally, chromium deposition is accomplished by electrodeposition from a chromium plating bath containing hexavalent chromium ions as a source of chromium. The process is highly toxic in nature. Lots of efforts have been made to develop alternative coatings and coating processes to replace the use of hexavalent chromium in electroplating. Among those alternative processes, trivalent chromium electroplating seems to be attractive due to convenience of fabrication through the use of environmental friendly and non-toxic chemicals and ability to produce a bright chromium deposit. However, an industrial scale process giving a hard and corrosion resistant chromium deposit through an aqueous trivalent chromium solution is still missing. Among the industry, there is a hectic need for a well manageable and easy to use chromium based coating process to replace the current use of hexavalent chromium in coating.

Decorative chrome is designed to be aesthetically pleasing and durable. The thickness of decorative chromium coating is generally between 0.05 and 0.5 µm. There has been a strong movement away from hexavalent decorative chromium baths to new trivalent chromium baths. The trivalent form of chromium is considered to be less toxic.

Hard chrome is used to reduce friction, improve durability through abrasion tolerance and wear resistance, minimize galling or seizing of parts, expand chemical inertness to include a broader set of conditions, and as bulking material for worn parts to restore their original dimensions. Hard chromium coatings tend to be thicker than decorative chromium coatings. The thickness of hard chrome can be as high as 200-600 µm. Due to its thickness, the hardness of hard chrome is usually over 700 HV. Today, hard chrome is almost exclusively electroplated from hexavalent chromium baths because of difficulties in reaching desired wear resistance and hardness by using trivalent chromium baths.

Many chromium plating processes of prior art are not capable of producing coatings with a Vickers microhardness value of 2000 HV or more. Further defects of the known chromium-based coatings are their inadequate wear and corrosion resistances. Chromium coating as such is very brittle in character. The number of cracks and microcracks in a chromium coating increases together with the thickness of the coating, thus impairing the corrosion resistance of the coating.

Deposition of nickel, either by electroless plating or electroplating, has also been proposed as an alternative to hard chrome. Drawbacks of nickel plating include deficiencies in hardness, friction coefficient, wear resistance, corrosion resistance and adhesion. Nickel plating and hard chrome are not interchangeable coatings. The two have unique deposit properties and, therefore, each has its distinct applications.

It is well known in the art that the hardness of a chromium coating can be improved, to some extent, by thermal treatment. According to P. Benaben, An Overview of Hard Cromium Plating Using Trivalent Chromium Solutions, http://www.pfonline.com/articles/an-overview-of-hard-chromium-plating-using-trivalentchromium-solutions, the microhardness of a chromium deposit as-plated is about 700-1000 $HV_{100}$. By a heat treatment at 300-350° C. the microhardness of trivalent Cr can be increased up to about 1700-1800 $HV_{100}$. At higher temperatures the hardness of the Cr deposit tends to decrease. Adhesion of a trivalent Cr layer is known to cause problems. The process chemistry of known trivalent Cr baths is often very complicated and hard to manage.

U.S. Pat. No. 5,271,823 A discloses a method for providing a wear resistant Cr coating on a metal object, including the steps of electrodepositing a coating made solely from trivalent Cr ions and devoid of hexavalent Cr ions on the object and heating the coating to a temperature of at least 66° C. for at least 30 minutes.

U.S. Pat. No. 5,413,646 A discloses a method for electroplating a workpiece, comprising the steps of providing a plating bath comprising trivalent Cr produced by reducing a Cr(VI) compound to Cr(III) compound with methanol or formic acid, providing an anode in the plating bath, placing the workpiece in the bath to act as a cathode, electroplating a chromium and iron metal layer onto the workpiece, and heating the workpiece from about 316° C. to about 913° C. for a sufficient period of time to harden the workpiece while retaining or increasing the hardness of the chromium alloy plated on the workpiece.

U.S. Pat. No. 6,846,367 B2 discloses a heat-treating method for improving the wear and corrosion resistance of a chromium-plated steel substrate, comprising the steps of plating a chromium layer onto an steel substrate and heating the chromium-plated steel substrate in an oxidizing gas environment at above atmospheric pressure to form oxidized layers containing magnetite ($Fe_3O_4$) on the surface of the steel substrate, the surface of the steel substrate being partly exposed to the air through penetrating cracks formed in the chromium layer.

U.S. Pat. No. 7,910,231 B2 discloses a method for producing a coated article comprising a substrate and a coating on the substrate, the coating comprising chromium and phosphorus, Cr and P being present in at least one of the compounds CrP and $Cr_3P$. Phosphorus is brought into the coating as a part of the chromium solution, and the maximum hardness that can be reached after a heat treatment is 1400-1500 HV. The coating lacks nickel, as do all the other chromium coatings referred to above.

The hardness, friction coefficient, wear and corrosion resistance of known trivalent Cr coatings are not sufficient to satisfy the demands of industry. The coating processes of prior art are not capable of producing coatings with a Vickers microhardness value of about 2000 HV or more.

Apparently, there is a need in the art to find a cost-effective trivalent chromium-based electroplating method, which is able to yield such utmost mechanical properties that enable replacement of hexavalent chromium baths in industrial use.

PURPOSE OF THE INVENTION

The purpose of the invention is to eliminate, or at least reduce, the problems faced in the prior art.

More precisely, a purpose of the invention is to provide an environmentally friendly method for producing chromium coatings having superior mechanical and chemical properties.

A still further purpose of the invention is to provide a coating with progressively increasing hardness of layers so that the coating is able to withstand surface pressure already at relatively low thicknesses. This brings about cost savings as a sufficient performance can be reached with thinner coatings and lower production costs then previously.

SUMMARY

The method according to the present invention is characterized by what is presented in claim 1.

The coated object according to the present invention is characterized by what is presented in claim 17.

The present method comprises depositing a layer of nickel phosphorus alloy (NiP) on an object to be coated, depositing an intermediate layer on the NiP layer, the intermediate layer consisting of another metal or metal alloy or ceramic, and depositing a layer of chromium from a trivalent chromium bath on the intermediate layer. After that the coated object is subjected to one or more heat treatments to amend the mechanical and physical properties of the coating and to produce multiphase layers comprising at least one layer containing crystalline Ni and crystalline $Ni_3P$ and at least one layer containing crystalline Cr.

In this connection, the wording "another metal or metal alloy" is used to refer to a metal or metal alloy other than nickel or NiP. The intermediate layer can consist of only one layer or it can consist of two or more separately deposited layers.

According to one embodiment of the invention, the intermediate layer contains copper or an alloy of copper.

According to one embodiment of the invention, the intermediate layer contains molybdenum or an alloy of molybdenum.

According to one embodiment of the invention, the intermediate layer contains inorganic nonmetallic solid (ceramic) selected from the group comprising metal oxides, metal carbides, metal borides, metal nitrides, metal silicides, and mixtures thereof.

According to one embodiment of the invention, a strike layer is deposited on the object before depositing the NiP layer. A strike layer can be used to improve the adhesion between two layers. The strike layer can consist of, for instance, sulphamate nickel, bright nickel, titanium, or any other suitable material.

The phosphorus content of the NiP alloy can be in the range of 1-15%, preferably 3-12%, more preferably 5-9%. The NiP layer can be deposited by electroless or electrolytic plating.

The temperature in the one or more heat treatments can be 200-1000° C., preferably 400-750° C., more preferably 500-700° C.

According to one embodiment of the invention, the coated object is subjected to two or more heat treatments and cooled after each heat treatment.

According to one embodiment of the invention, at least one of the heat treatments is carried out at a temperature between 500 and 700° C.

According to one embodiment of the invention, the temperature in a first heat treatment is 200-500° C., preferably 350-450° C., and the temperature in a second heat treatment is 500-800° C., preferably 650-750° C.

According to another embodiment of the invention, the temperature in a first heat treatment is 500-800° C., preferably 650-750° C., and the temperature in a second heat treatment is 200-500° C., preferably 350-450° C.

According to one embodiment of the invention, the object to be coated is of metal and the hardening of the metal of the object is carried out at the same time as the coated object is heat-treated.

According to a further embodiment of the invention, the object to be coated is of steel and the heat treatment is carried out at a temperature between 750 and 1000° C., preferably 800-950° C.

In case the hardening of a metal object is carried out in connection with a heat treatment of the coated object, it is possible to subsequently subject the object to annealing or tempering in a second heat treatment, which is carried out after quenching.

It is also possible to subject an already hardened metal object to a further hardening during the heat treatment of the coated object even though the metal object had originally been hardened before the coating.

One embodiment of the present invention comprises repeating the depositing steps two or more times to produce a multilayer coating containing at least two layers of NiP, at least two layers of Cr, and at least one intermediate layer, after which the multilayer-coated object is subjected to one or more heat treatments. When producing a multilayer coating, it is possible to leave out one or more of the intermediate layers. In that case, a layer of chromium can be deposited next to a layer of NiP or a nickel strike layer.

One embodiment of the invention comprises the step of depositing a top layer on the coated and heat-treated object by thin film deposition, such as physical vapor deposition (PVD), chemical vapor deposition (CVD) or atomic layer deposition (ALD). The top layer can be made of any suitable material that is able to give the coated surface the desired properties. Suitable materials comprise, for instance, metals, metal alloys, ceramics such as titanium nitride (TiN) or chromium nitride (CrN), and diamond like carbon (DLC).

Alternatively, it is possible to produce a thin film deposited top layer on the coated object before a heat treatment.

The coating of an object coated using a method according to the present invention comprises a multiphase layer containing crystalline Ni and crystalline $Ni_3P$, an intermediate layer of another metal or metal alloy or ceramic, and a multiphase layer containing crystalline Cr.

The intermediate layer can consist of, for instance, copper or an alloy of copper, molybdenum or an alloy of molybdenum or inorganic nonmetallic solid (ceramic) selected from the group comprising metal oxides, metal carbides, metal borides, metal nitrides, metal silicides, and mixtures thereof.

The coated object can be provided with a top layer which has been applied on the coated object by thin film deposition, such as physical vapor deposition (PVD), chemical vapor deposition (CVD) or atomic layer deposition (ALD).

The top layer can consists of metal, metal alloy, or ceramic, such as titanium nitride (TiN) or chromium nitride (CrN), or diamond like carbon (DLC).

The coated object can have a Vickers microhardness value higher than 2000 HV.

The heat treatment of the coated object can be carried out, for instance, in conventional gas furnaces. Alternatively, heat treatment can be carried out by processes based on induction, flame heating or laser heating. Induction heating is a no-contact process that quickly produces intense, localized and controllable heat. With induction it is possible to heat only the selected parts of the coated object. Flame heating refers to processes where heat is transferred to the object by means of a gas flame without the object melting or material being removed. Laser heating produces local changes on the material surface while leaving the properties of the bulk of an object unaffected. Heat-treating with laser involves solid-state transformation, so that the surface of the coated object is not melted. Both mechanical and chemical properties of a coated article can often be greatly enhanced through the metallurgical reactions produced during heating and cooling cycles.

The properties of the coating can be adjusted and improved as desired by depositing a suitable intermediate layer between the layers of NiP and Cr. An intermediate layer can be deposited to improve the adhesion between the layers of NiP and Cr. The corrosion resistance of the coated object can be improved, for instance, by depositing an intermediate layer whose galvanic potential differs from the galvanic potentials of the layers next to it. An intermediate layer of nonmetallic solid, such as $Al_2O_3$ or TiN, can be used to strengthen the structure of the coating against mechanical or chemical stresses.

By means of a method according to the present invention it is possible to produce chromium coatings having excellent corrosion resistance and extremely high hardness (Vickers microhardness 1000-3000 HV). The coating process itself is safe and less toxic than coating processes where hexavalent chromium is involved.

BRIEF DESCRIPTION OF THE DRAWINGS

The accompanying drawings, which are included to provide a further understanding of the invention and constitute a part of this specification, illustrate embodiments of the invention and together with the description help to explain the principles of the invention.

DETAILED DESCRIPTION OF THE INVENTION

Figure 1:
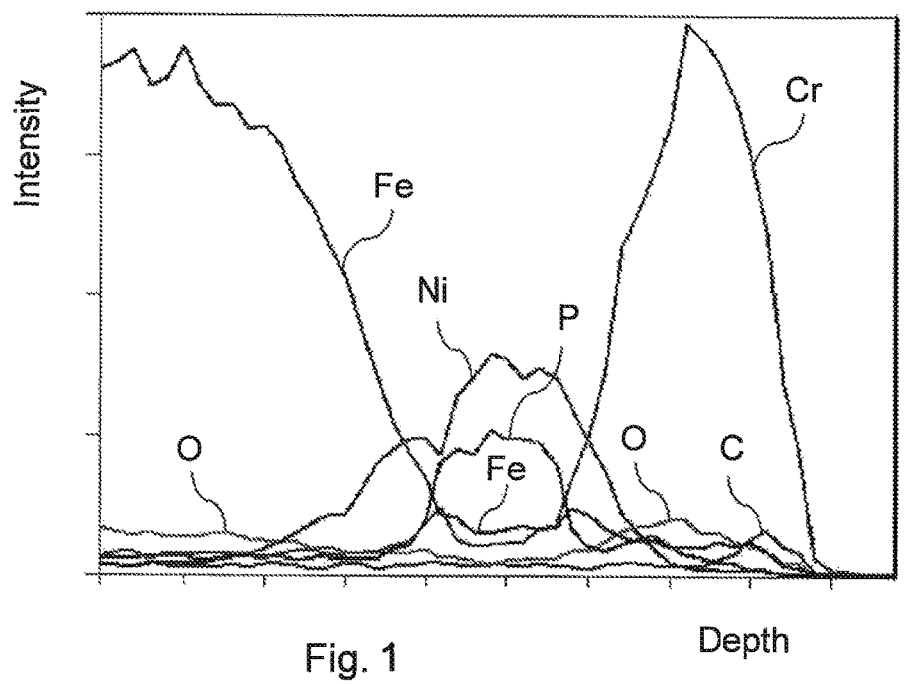
FIG. 1 is an example of EDS spectrum of a NiP—Cr coating after a double heat treatment at 400° C. and 700° C.

The object to be coated by the present method can be a metal object made of, for instance, steel, copper, bronze, brass, etc, or it can be an object made of ceramics or plastics. The new coating can be used to replace decorative chrome or hard chrome coatings.

The object to be coated can be subjected to appropriate pretreatment steps, such as chemical and/or electrolytic degreasing to remove oil and dirt from the surface, and pickling to activate the surface before the actual coating steps.

Next, the object can be subjected to electroless nickel-phosphorus deposition, whereby a NiP layer is chemically deposited on the pretreated object. The NiP layer can be deposited, for instance, from a solution formulated with sodium hypophosphite as a reducing agent. The nickel film deposited on the object contains 1-15 wt-% phosphorus, preferably 3-12 wt-%, more preferably 5-9 wt-%. The thickness of the NiP layer can be 1-100 µm, preferably 3-30 µm.

Alternatively, the nickel phosphorus layer can be deposited on the object by electroplating.

If necessary, a nickel underlayer can be deposited on the pretreated object before depositing the NiP layer. To this purpose, the object is immersed into a suitable nickel bath, such as a nickel sulfamate bath, through which an electric current is passed, resulting in deposition of a Ni underlayer on the metal substrate. The procedure can be repeated as many times as necessary in case a thicker underlayer is needed. In connection with decorative chrome coating, a bright nickel bath can be employed to produce a bright and corrosion resistant Ni underlayer. The Ni underlayer can alternatively be produced by electroless deposition. The thickness of the Ni underlayer can be, for instance, 10-20 µm. In connection with hard chrome coating, a Ni underlayer can usually be omitted as no additional corrosion protection is needed.

After deposition of the NiP layer, an intermediate layer can be deposited on the NiP layer by electroplating or electroless plating. The intermediate layer is of another metal or metal alloy or ceramic. Metals and metal alloys suitable for use in the intermediate layer comprise at least but not exclusively copper, alloys of copper, molybdenum and alloys of molybdenum. Ceramics suitable for use in the intermediate layer comprise inorganic nonmetallic solids, such as metal oxides, metal carbides, metal borides, metal nitrides, metal silicides, and mixtures thereof.

After that a layer of chromium is deposited from a trivalent chromium bath on the intermediate layer. Electroplating with trivalent chromium can be carried out using any suitable coating process that is industrially usable, for instance, in decorative Cr plating. One example of electrolyte solutions that can be used is the one traded by Atotech Deutschland GmbH under the trade name Trichrome Plus®. This electrolyte solution comprises 20-23 g/l trivalent chromium ions and 60-65 g/l boric acid. The working parameters of the process are: pH 2.7-2.9, temperature 30-43° C., and cathodic current density 8-11 $A/dm^2$. The thickness of the Cr layer deposited can be 0.05-100 µm, preferably 1-10 µm.

After deposition of chromium layer, the coated object can be subjected to one or more heat treatment sequences. Heat treatments can be carried out at a temperature between 200-1000° C., preferably 400-750° C., more preferably 500-700° C. Preferably, the process comprises two or more successive heat treatments and the coated object is cooled between the heat treatments. Heat treatments can be carried out, for instance, in a conventional gas furnace, in which case the duration of one heat treatment can be 20-60 minutes. Alternatively, heat treatments can be carried out by induction, flame heating, or laser heating. Induction heating is a no-contact process that quickly produces intense, localized and controllable heat. With induction, it is possible to heat only selected parts of the coated metal substrate. Flame heating refers to processes where heat is transferred to the object by means of a gas flame without the object melting or material being removed. Laser heating produces local changes at the surface of the material while leaving the properties of the bulk of a given component unaffected. Heat-treating with laser involves solid-state transformation, so that the surface of the metal is not melted. Both mechanical and chemical properties of a coated article can often be greatly enhanced through the metallurgical reactions produced during heating and cooling cycles.

It is also possible to carry out the hardening of the metal of the object that has been coated simultaneously with the heat treatment of the coating. Hardening is a metallurgical process used to increase the hardness of a metal. As an example, steel can be hardened by cooling from above the critical temperature range at a rate that prevents the formation of ferrite and pearlite and results in the formation of martensite. Hardening may involve cooling in water, oil or air, according to the composition and size of the article and the hardenability of the steel. The steel must contain sufficient carbon to achieve a useful hardening response.

After a heat treatment carried out at a steel hardening temperature (e.g. 750-1000° C.), the coated metal object can be subjected to annealing or tempering by carrying out a heat treatment at a lower temperature.

Hardening of the metal object can be carried out during the heat treatment of the multilayer coated object even though the metal object has been subjected to hardening before the coating. Good results have been achieved by this kind of further hardening of a coated metal object.

Finally, a dense top layer can be applied on the coated object by thin film deposition, such as physical vapor deposition, chemical vapor deposition or atomic layer deposition. The top layer can consist of a suitable metal, metal alloy, ceramic, such as titanium nitride or chromium nitride, or diamond like carbon (DLC). The top layer can be deposited on the coated object either before or after subjecting the object to the heat treatment.

It has been noticed that improved surface properties, such as notably high hardness values, increased corrosion and wear resistance, and reduced friction coefficient, can be acquired by heat treatment of the present coating. For instance, hardness values as high as 2500-3000 HV have been measured in the tests.

Example 1

Several steel objects were coated with a NiP layer of 7 μm and a Cr layer of 4 μm, after which the coated objects were subjected to double heat treatment sequence. The first heating step was carried out at a temperature between 200° C. and 700° C. for 30 or 45 minutes, after which the coated object was cooled. The second heating step of the same sample was carried out at a temperature between 400° C. and 700° C. with duration between 5 and 30 minutes, after which the coated object was cooled again.

The hardness values of the coated and heat-treated objects were measured by Vickers hardness test in micro range using indenter weights of 5, 10 or 25 g depending on the thickness of coating. The test was carried out according to EN-ISO 6507.

The corrosion resistance of the coated and heat-treated objects was measured by Acetic Acid Salt Spray Test (AASS) according to SFS-EN ISO 9227.

The friction coefficients of the coated and heat-treated objects were measured with a Pin-On-Disk friction measuring device. A shaft was rotated at a speed of 300 rpm for 30 minutes. A ball made of $Al_2O_3$ was pressed against the rotating surface of the shaft with a load of 100-500 g.

For comparison, corrosion and friction tests were made also for other commercial references with the same testing parameters.

Table 1 shows the hardness, depth of wear and friction coefficient measured from three commercial products (A, B, C) and the same properties measured from a double heat-treated NiP—Cr coating (D). POD wear tests were carried out with an $Al_2O_3$ ball of 200 g at a speed of 300 rpm. In the wear test of the new coating the $Al_2O_3$ ball was worn out whereas the coating remained intact.

TABLE 1

| | Coating | Hardness HV | Wear depth μm | Friction coefficient | Coating thickness μm |
|---|---|---|---|---|---|
| A | Hard chrome | 950 | 0.6 | 0.38 | 40 |
| B | Thermal spraying 7505 | 1300 | 0.45 | 0.7 | 300 |
| C | Black nitration | 500 | 2 | 0.5 | |
| D | 700° C./30 min + 400° C./30 min | 2400 | 0 | 0.14 | 20 |

The results of the tests indicated that the hardness of the coating increases as the temperature of the first heating step is raised from 200° C. to 700° C. If the process comprises only one heating step, a temperature between 400° C. and 600° C. gives hardness values between 1600 and 1900 HV. The second heating step increases the hardness of the coated object. Hardness values well over 2000 HV could be measured after the second heat treatment, the highest values being as high as 2500-3000 HV.

When searching for optimal conditions of heat treatment, good results could be achieved by a combination of a first step at 400° C. and a second step at 700° C. Hardness values of about 2500 HV were measured after the second step carried out at 700° C. with duration of 15-30 minutes. Good results could also be achieved by a combination of the first step at 700° C. and the second step at 400° C. Hardness values of about 3000 HV were measured after the second step carried out at 400° C. with duration of 15-30 minutes.

Cross-sectional views taken from coating verified the existence of three or four different layers in the coating. Heat treatment of the coated object affects the layers, creating various phases within and between the original layers as a result of diffusion, which phases improve the performance of the coating, for instance, against mechanical exertion. Hyper ternary multiphase alloy contains new extremely hard structures created during the heat treatment.

In the method according to the present invention, an intermediate layer is deposited between the layers of NiP and Cr, which intermediate layer can be of another metal, metal alloy or ceramic. It has been observed that depositing an intermediate layer between the layers of NiP and Cr does not impair the properties of the coating; on the contrary, some properties can be improved by means of the intermediate layer.

Example 2

A steel object was coated with a NiP layer of 7 μm and a Cr layer of 4 μm. Heat treatments were carried out in two steps: the first step took 45 minutes at 400° C. and the second step took 30 minutes at 700° C.

The Vickers microhardness values measured from the coated object after double heat treatment were about 2500 HV, measured with a load of 10 g.

A layered structure could be identified in a cross-sectional micrograph of the coated surface. The composition of the coating was analyzed by energy-dispersive X-ray spectroscopy (EDS) by having an electron beam follow a line on the sample image and generating a plot of relative proportions of previously identified elements along that spatial gradient. FIG. 1 shows the EDS spectrum of the sample. The steel substrate is on the left side of the graph and the surface of the coating is on the right side of the graph.

The following layers can be identified in the sample, proceeding from the steel substrate toward the outer surface of the coating:
- a layer rich in Fe (steel substrate),
- a layer mainly containing Fe and Ni,
- a layer mainly containing Ni and P,
- a layer mainly containing Ni and Cr,
- a layer mainly containing Cr and O,
- a layer mainly containing Cr and C.

Figure 2:
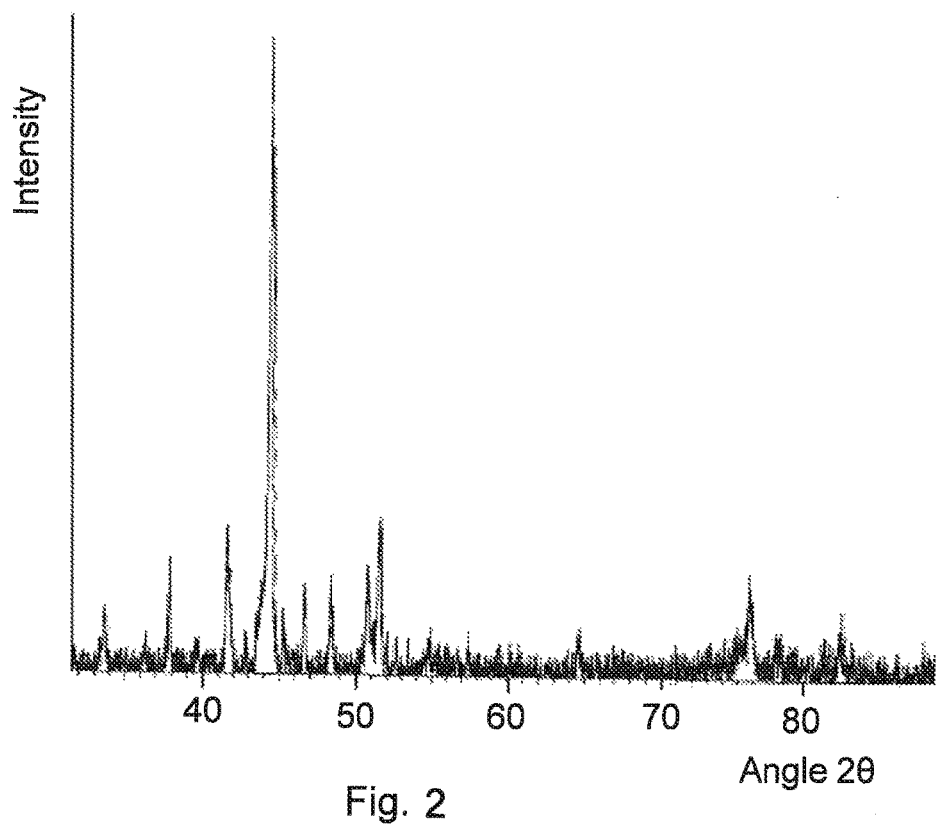
FIG. 2 shows a part of the XRD spectrum of the coating of FIG. 1.

Also the X-ray diffraction spectrum (XRD) of the sample was measured. FIG. 2 shows a part of the XRD spectrum of the sample.

Depositing an intermediate layer between the layers of NiP and Cr would not impair the properties of the coating; on the contrary, some properties can be improved by means of the intermediate layer.

Example 3

Another steel object was coated with a similar coating as in Example 2, the coating comprising a NiP layer of 7 μm and a Cr layer of 4 μm. Heat treatment was carried out in two steps: a first step of 30 minutes at 400° C. and a second step of 30 minutes at 700° C.

The Vickers microhardness values measured from the coated and heat-treated object were in the range of 2500-3000 HV, measured with a load of 10 g.

Figure 3:
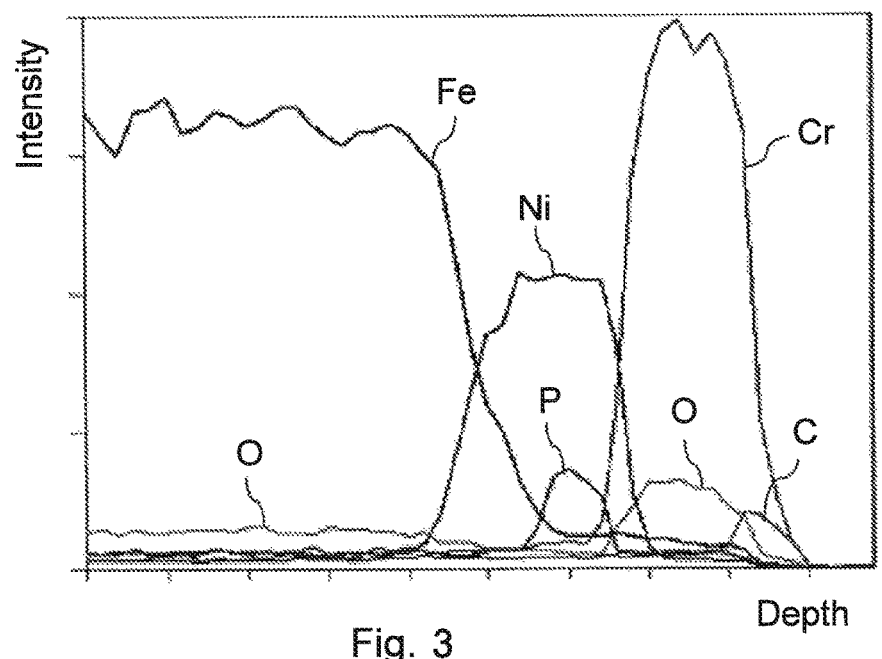
FIG. 3 is an example of EDS spectrum of a NiP—Cr coating after double heat treatment at 700° C. and 400° C.

A layered structure could be identified in a cross-sectional micrograph of the coating. FIG. 3 shows the EDS of the sample. The following layers could be identified in the sample, proceeding from the steel substrate toward the outer surface of the coating:
- a layer rich in Fe (steel substrate),
- a layer mainly containing Fe and Ni,
- a layer mainly containing Ni and P,
- a layer mainly containing Ni and Cr,
- a layer mainly containing Cr and O,
- a layer mainly containing Cr and C.

Figure 4:
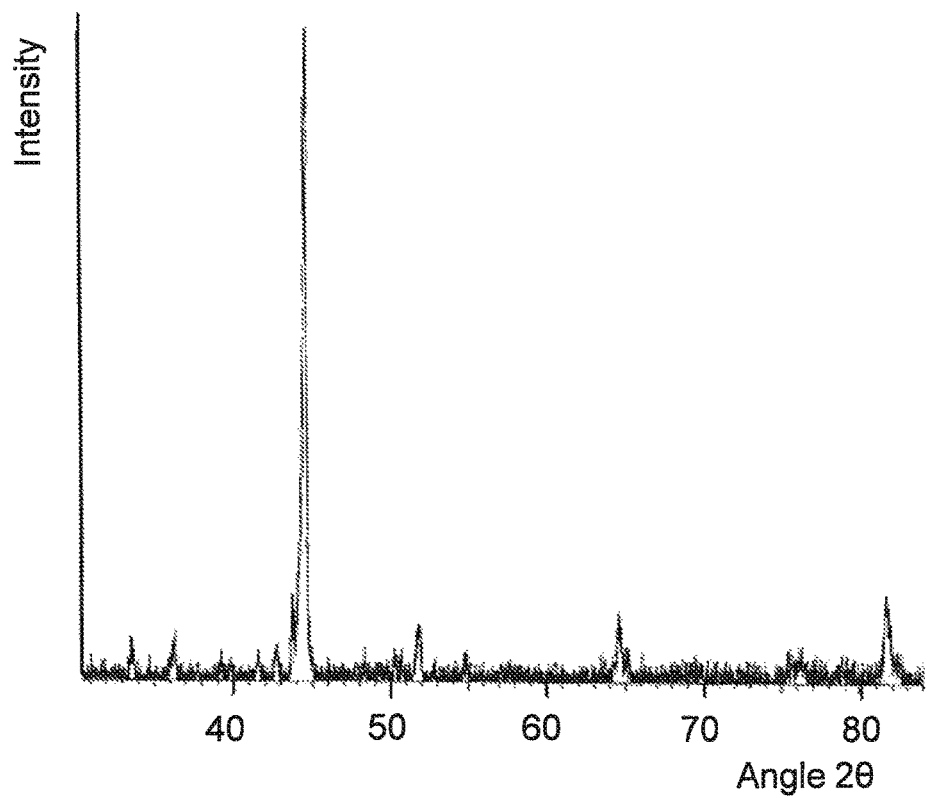
FIG. 4 shows a part of the XRD spectrum of the coating of FIG. 3.

FIG. 4 shows a part of the XRD spectrum of the sample. The XRD spectra of FIG. 2 (heat treatments at 400° C. and 700° C.) and FIG. 4 (heat treatments at 700° C. and 400° C.) indicate that, in both cases, there are crystalline phases present in the coating.

Depositing an intermediate layer between the layers of NiP and Cr would not impair the properties of the coating; on the contrary, some properties can be improved by means of the intermediate layer.

Example 4

Figure 5:
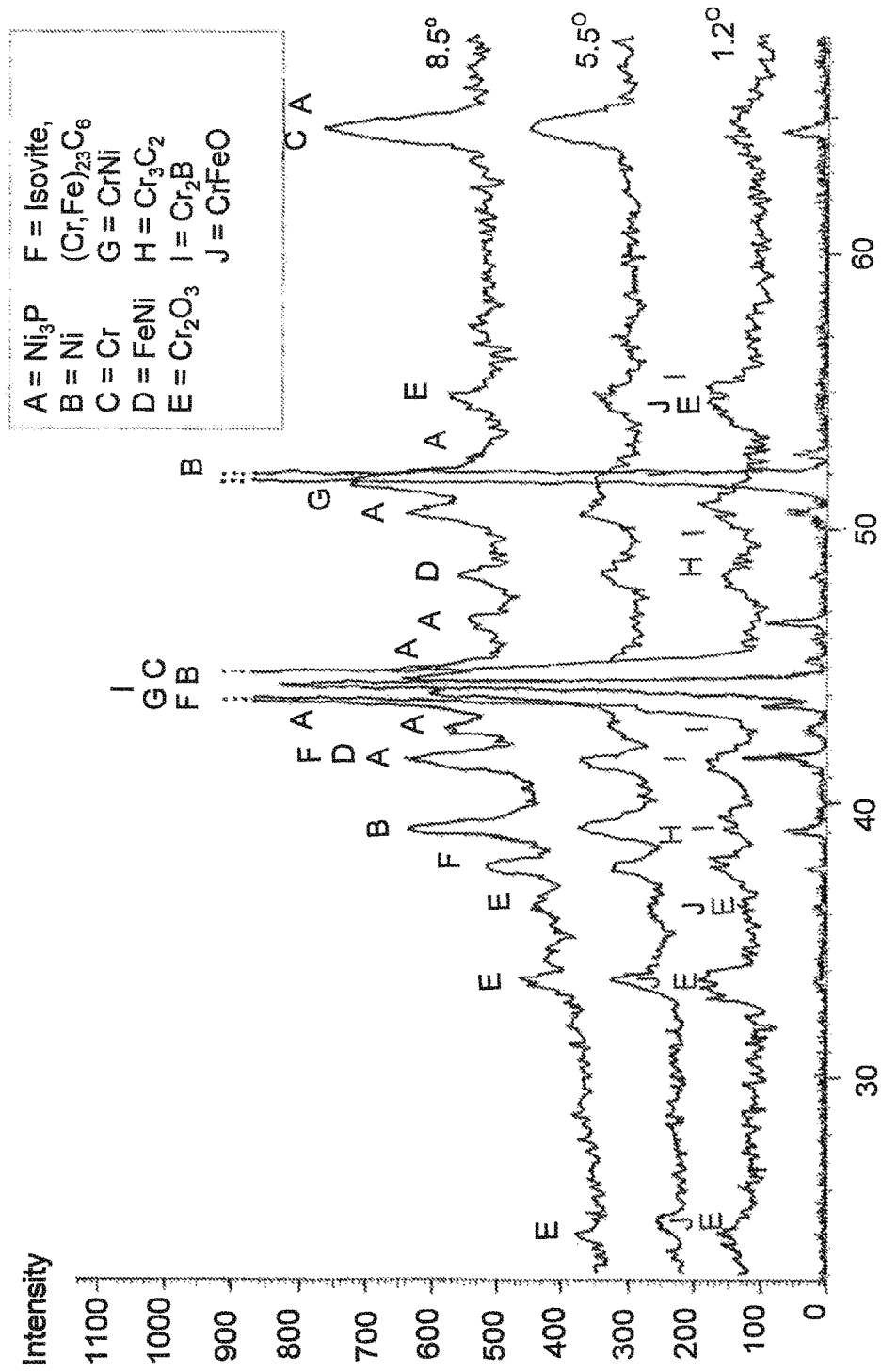
FIG. 5 shows the XRD and GID spectra of a NiP—Cr coating.

Grazing incidence diffraction (GID) was used to get a near-surface depth profile of the phase structure of coated surface. The results are shown in FIG. 5, with the conventional XRD spectrum on the bottom. The incident angles 1.2°, 5.5° and 8.5° represent different depths of the coating. Peaks of the XRD spectra measured with different incident angles were identified by comparing the measured spectra with the spectra of the elements known to be contained in the coated object.

The XRD spectra of the coated surface contain two higher peaks and several lower peaks. The first peak is located close to a diffraction angle $2\theta$ of 44-45°, corresponding to crystalline phases of $Ni_3P$, Ni and Cr. There are also traces of crystalline isovite $(Cr,Fe)_{23}C_6$, CrNi and $Cr_2B$ in the coating. The second peak is located close to a diffraction angle $2\theta$ of 51-52°, corresponding to crystalline phases of Ni and CrNi. Additionally, there is evidence of crystalline phases of $Cr_2O_3$, $Cr_3C_2$, $Cr_2B$ and CrFeO in the layers close to the surface. Deeper in the coating there is evidence of crystalline phases of $Ni_3P$, Ni, Cr, FeNi, $Cr_2O_3$ and CrNi.

In case there is an intermediate layer deposited between the layers of NiP and Cr, there will be no crystalline CrNi formed between said layers. However, the positive impact of a CrNi containing layer can be replaced with another positive impact produced by the materials used in the intermediate layer.

Example 5

A hardenable or surface-hardened metal object was coated with a strike nickel layer of 1 μm, a NiP layer of 3 μm and a Cr layer of 4 μm. The total thickness of the coating was about 8 μm. After this the object was heat-treated by induction heating in one step.

First the object was pre-heated by means of an induction loop with a power of 26 kW and a speed of 1500 mm/min. Then the temperature of the object was raised up to 850° C. by induction with a power of 26 kW and a speed of 1500 mm/min, after which the object was cooled with water jet.

The surface of the base material was hardened into the depth of about 1 mm and the hardness of the coating increased. The Rockwell hardness of the base material after hardening was 58 HRC and the Vickers microhardness of the coating was about 1800 HV.

Example 6

A hardenable metal object was coated with a strike nickel layer of 1 μm, a NiP layer of 3 μm and Cr layer of 4 μm. The total thickness of the coating was about 8 μm. After this the object was heat-treated by induction heating.

The temperature of the object was raised up to 850° C. by induction with a power of 60 kW and a speed of 1500 mm/min, after which the object was cooled with water jet.

The base material was hardened and the hardness of the coating increased. The Rockwell hardness of the base material after hardening was 55 HRC and the Vickers microhardness of the coating was about 1600 HV.

Example 7

A face-hardened metal object was coated with a first strike nickel layer of 1 μm, a first NiP layer of 3 μm, a first Cr layer of 4 μm, a second strike nickel layer of 1 μm, a second NiP layer of 3 μm and a second Cr layer of 4 μm. The total thickness of the coating was about 16 μm. After this the object was heat-treated by induction heating.

First the object was pre-heated by an induction loop with a power of 26 kW and a speed of 1500 mm/min. Then the temperature of the object was raised up to 850° C. by induction with a power of 26 kW and a speed of 1500 mm/min, after which the object was cooled with water jet.

The base material was hardened and the hardness of the coating increased. The Rockwell hardness of the base material after hardening was 58 HRC and the Vickers microhardness of the coating was about 1900 HV.

Example 8

An object was coated with a NiP layer of 7 μm and a Cr layer of 5 μm. The coated object was heated at 700° C. for 30 minutes. After this a top layer of DLC (diamond like carbon) was deposited on the coated object by thin film deposition.

The coating was very hard (Vickers microhardness over 2000 HV). The Pin-on-Disc sliding wear of the coated surface was 0 µm (test duration 210 min, load 500 g and speed 300 rpm). The friction coefficient of the coated surface was 0.24. The AASS corrosion test gave a value of over 200 h.

Alternatively, the top layer could also have been applied directly on the NiP—Cr coating, in which case the heat treatment could have been carried out after the thin film deposition step.

It is obvious to a person skilled in the art that with the advancement of technology, the basic idea of the invention may be implemented in various ways. The invention and its embodiments are thus not limited to the examples described above; instead they may vary within the scope of the claims.

The invention claimed is:

1. A method for producing a chromium coating on an object by trivalent chromium plating, the method comprising the steps of:
   depositing a layer of nickel phosphorus alloy (NiP) on the object;
   depositing an intermediate layer on the NiP layer, the intermediate layer consisting of another metal or metal alloy or ceramic;
   depositing a layer of chromium from a trivalent chromium bath on the intermediate layer; and
   after the depositing of the layer of chromium, subjecting the coated object to one or more heat treatments to harden the coating to have a Vickers microhardness of 1000-3000 HV and to produce multiphase layers comprising at least one layer containing crystalline Ni and crystalline $Ni_3P$ and at least one layer containing crystalline Cr, and wherein the coating comprises crystalline isovite $(Cr,Fe)_{23}C_6$ and/or $Cr_3C_2$, and wherein the temperature in the one or more heat treatments is 500-1000° C.

2. The method according to claim 1, wherein the intermediate layer contains copper or an alloy of copper.

3. The method according to claim 1, wherein the intermediate layer contains molybdenum or an alloy of molybdenum.

4. The method according to claim 1, wherein the intermediate layer contains inorganic nonmetallic solid selected from the group comprising metal oxides, metal carbides, metal borides, metal nitrides, metal silicides, and mixtures thereof.

5. The method according to claim 1, further comprising the step of depositing a nickel strike layer on the object before depositing the NiP layer.

6. The method according to claim 1, wherein the phosphorus content of the NiP alloy is 1-15 w-%.

7. The method according to claim 1, wherein the temperature in the one or more heat treatments is 500-700° C.

8. The method according to claim 1, wherein the coated object is subjected to two or more heat treatments and cooled after each heat treatment.

9. The method according to claim 8, wherein at least one of the heat treatments is carried out at a temperature between 500 and 700° C.

10. The method according to claim 8, wherein the temperature in a second heat treatment is 500-800° C.

11. The method according to claim 8, wherein the temperature in a first heat treatment is 500-800° C.

12. The method according to claim 1, wherein the object to be coated is of metal and the hardening of the metal of the object is carried out at the same time as the coated object is heat-treated.

13. The method according to claim 12, wherein the object to be coated is of steel and the one or more heat treatments are carried out at a temperature between 750 and 1000° C.

14. The method according to claim 1, comprising repeating the steps of depositing the layer of NiP, depositing the intermediate layer and depositing the layer of chromium from the trivalent chromium bath two or more times to produce a multilayer coating containing at least two layers of NiP, at least two layers of Cr, and at least one intermediate layer, after which the multilayer-coated object is subjected to one or more heat treatments.

15. The method according to claim 1, further comprising the step of depositing a top layer on the coated and heat-treated object by physical vapor deposition (PVD), chemical vapor deposition (CVD) or atomic layer deposition (ALD).

16. The method according to claim 1, further comprising the step of depositing a top layer on the coated object by physical vapor deposition (PVD), chemical vapor deposition (CVD) or atomic layer deposition (ALD), before the step of subjecting the coated object to one or more heat treatments.

17. The method according to claim 1, wherein the coating has a Vickers microhardness value between 2000 and 3000 HV.

18. The method according to claim 10, wherein the temperature in the second heat treatment is 650-750° C.

19. The method according to claim 11, wherein the temperature in the first heat treatment is 650-750° C.

* * * * *